(12) United States Patent
Mahapatra et al.

(10) Patent No.: US 9,013,092 B2
(45) Date of Patent: Apr. 21, 2015

(54) ENERGY HARVESTING DEVICES USING CARBON NANOTUBE (CNT)-BASED ELECTRODES

(75) Inventors: Debiprosad Roy Mahapatra, Bangalore (IN); Arvind Krishnaswamy, Bangalore (IN)

(73) Assignee: Indian Institute of Science, Bangalore, Karnataka (IN)

( * ) Notice: Subject to any disclaimer, the term of this patent is extended or adjusted under 35 U.S.C. 154(b) by 453 days.

(21) Appl. No.: 13/139,413

(22) PCT Filed: Nov. 22, 2010

(86) PCT No.: PCT/IB2010/055322
§ 371 (c)(1),
(2), (4) Date: Jun. 13, 2011

(87) PCT Pub. No.: WO2011/151679
PCT Pub. Date: Dec. 8, 2011

(65) Prior Publication Data
US 2012/0043858 A1    Feb. 23, 2012

(30) Foreign Application Priority Data
Jun. 2, 2010   (IN) .......................... 1526/CHE/2010

(51) Int. Cl.
*H02N 2/18*     (2006.01)
*B82Y 15/00*    (2011.01)
*F03G 7/00*     (2006.01)

(52) U.S. Cl.
CPC ................ *B82Y 15/00* (2013.01); *F03G 7/005* (2013.01)

(58) Field of Classification Search
CPC ....... H02N 2/18; F23Q 3/002; H01L 41/1136
USPC .................................................. 310/339, 363
See application file for complete search history.

(56) References Cited

U.S. PATENT DOCUMENTS 3,282,875 A      11/1996   Connolly et al.
6,433,365 B1 *   8/2002    Takahashi et al. .............. 257/82
(Continued)

OTHER PUBLICATIONS

International Search Report and Written Opinion prepared by the Australian Patent Office in PCT/IB2010/055322, date of mailing Apr. 8, 2011.
(Continued)

*Primary Examiner* — Derek Rosenau
*Assistant Examiner* — Bryan Gordon
(74) *Attorney, Agent, or Firm* — Moritt Hock & Hamroff LLP; Steven S. Rubin, Esq.

(57) ABSTRACT

Energy harvesting elements or membranes are provided that use a layer of electrodes with a mixture of carbon nanotubes (CNT). The energy harvesting device of this type can be used as in sensor-based system in which on application of a bending load, the energy harvesting device produces a voltage across the electrodes. The energy harvesting device may include an electrode coating including carbon nanotubes (CNT) substantially homogenously dispersed in epoxy resin system to form a CNT-epoxy electrode coating. The CNT-epoxy electrode can be realized by dispersing about 5% CNT (by weight) in an epoxy-resin system, followed by mixing the system to achieve a near-homogenous dispersion resulting in a CNT-epoxy mixture. The CNT-epoxy mixture can then be uniformly coated on surfaces of a polymer to form electrodes.

17 Claims, 9 Drawing Sheets

(56) References Cited

U.S. PATENT DOCUMENTS

| | | | |
|---|---|---|---|
| 6,433,465 B1* | 8/2002 | McKnight et al. | 310/339 |
| 2006/0113878 A1 | 6/2006 | Pei et al. | |
| 2006/0266981 A1 | 11/2006 | Asaka et al. | |
| 2009/0015022 A1* | 1/2009 | Rome et al. | 290/1 A |
| 2009/0213551 A1* | 8/2009 | Wyland | 361/708 |
| 2010/0122980 A1* | 5/2010 | Wang et al. | 219/553 |
| 2010/0301299 A1* | 12/2010 | Suh et al. | 257/1 |
| 2010/0310939 A1* | 12/2010 | Yoshida | 429/231.8 |

OTHER PUBLICATIONS

S V Anand et al, "Energy harvesting using ionic electro-active polymer thin films with Ag-based electrodes" Smart Mater. Struct. 2010, 19 045026.

Kenneth A Mauritz and Robert B Moore, "State of Understanding of Nafion", Chem. Rev. 2004, 104 (10), 4535-4586.

M Shahinpoor et al, "Ionic Polymer-Metal Composites (IPMC) As biomimetic Sensors and Actuators", SPIE 1998, 3324-27.

Matthew D Bennett and Donald J Leo, "Ionic liquids as stable solvents for ionic polymer transducers", Sensors and Actuators A, 2004, 115 79-90.

C Thomsen et al, "Chirality Distribution and Transition Energies of Carbon Nanotubes", Phys. Rev. Letters 2004, 93.177401.

T Wang Odom et al, "Atomic structure and electronic properties of single-walled carbon nanotubes", Nature 1998, vol. 391.

Sandeep V Anand and D Roy Mahapatra, "The dynamics of polymerized carbon nanotubes in semiconductor polymer electronics and electro-mechanical sensing", Nanotechnology 2009, 20 145707.

Dibakar Bandopadhya and James Njuguna, "Estimation of bending resistance of Ionic Polymer Metal Composite (IPMC) actuator following variable parameters pseudo-rigid body model", Materials Letters 2009, 63 745-747.

Ahish et al., "Coupled Electro-Mechanical Response of an Electroactive Polymer Cantilever Structure and its Application in Energy Harvesting", Proceedings of SPIE, 2009, vol. 7287.

Kang et al., "All-Organic Actuator Fabricated with Single Wall Carbon Nanotube Electrodes", Journal of Polymer Science: Part B: 2008, vol. 46.

Chandrakasan A, Amirtharajah R, Cho S H, Goodman J, Konduri G, Kulik J, Rabiner W, and Wang A 1999 Design Considerations for Distributed Microsensor Systems Proceedings of the 21st IEEE Annual Custom Integrated Circuits Conference 279-286.

Sodano H A, Inman D J, and Park G 2004 A review of Power Harvesting from Vibration using Piezoelectric Materials Shock and Vibration Digest 36 197-205.

Shahinpoor M and Kim K J 2001 Ionic polymer-metal composites: I. Fundamentals Smart Materials and Structures 10 819-833.

Shahinpoor M and Kim K J 2003 Ionic polymer-metal composites: II. Manufacturing Techniques Smart Materials and Structures 12 65-79.

Shahinpoor M, Bar-Cohen Y, Simpson J, Smith J 1998 Ionic polymermetal composites as biomimetic sensors, actuators and artificial muscles-a review Smart Materials and Structures 7 15-30 [7].

Mallavarapu K and Leo D J 2001 Feedback control of the bending response of ionic polymer actuators Journal of Intelligent Material Systems and Structures 12 143-155.

Farinholt K and Leo D J 2004 Modeling of Electromechanical charge sensing in Ionic polymer transducers Mechanics of Materials 36 421-433.

Nemat-Nasser S 2000 Electromechanical response of ionic polymer-metal composites Journal of Applied Physics 87 3321-3331.

Nemat-Nasser S 2002 Micromechanics of actuation of Ionic polymer-metal composites Journal of Applied Physics 92 2899-2920.

Brufau-Penella J, Puig-Vidal M, Giannone P, Graziani S and Strazzeri S 2008 Characterization of the harvesting capabilities of an ionic polymer metal composite device Smart Materials and Structures 17 015009.

Roundy S, Wight P K and Rabaey J 2003 A study of low level vibrations as a power source for wireless sensor nodes Computer Communications 26 1131-1144.

Ericka M, Vasic D, Costa F and Poulain G 2006 Predictive energy harvesting from mechanical vibration using a circular piezoelectric membrane IEEE Ultrasonics Symposium 2005 2 946-949.

Kang I, Heung Y Y, Jay Kim H, Lee J W, Gollapudi R, Subramaniam S, Narasimhadevara S, Hurd D, Kirikera G R, Shanov V, Schulz M J, Shi D, Boerio J, Mall S and Ruggles-Wren M 2006 Introduction to carbon nanotube and nanofiber smart materials Composites : Part B 37 382-394.

Brian Landi J, Ryne Raffaelle P, Michael Heben J, Jeffrey Alleman L, Vanderveer W, and Gennett T 2002 Single Wall Carbon Nanotube-Nafion Composite Actuators Nano Letters 211 1329-1332.

Kundu S, Leonardo Simon C, Fowler M and Grot S 2005 Mechanical properties of Nafion electrolyte membranes under hydrated conditions Polymer 46 11707-11715.

* cited by examiner

Micro-cracks in metal-polymer electrodes formed after a few cycles

ENERGY HARVESTING DEVICES USING CARBON NANOTUBE (CNT)-BASED ELECTRODES

The present application claims priority to Indian patent application serial no. 1526/CHE/2010 filed on Jun. 2, 2010. The present application is a U.S. National Phase Application pursuant to 35 U.S.C. §371 of International Application No. PCT/IB2010/055322, filed on Nov. 22, 2010, the entire contents of which are herein incorporated by reference.

BACKGROUND

Traditionally, electrical power has been generated in large, centralized plants powered by fossil fuels, nuclear fission or flowing water, for example. Input fuel to such large scale power generation requires oil or coal, for example, which may not be readily available in all areas of the world.

Energy harvesting or energy scavenging from existing environmental sources has become an interest due to dwindling natural resources around the world. Energy harvesting is a process by which energy is derived from external sources (e.g., solar power, thermal energy, wind energy, salinity gradients, and kinetic energy), captured, and/or stored. In contrast to traditional electrical power plants, fuel for energy harvesters is naturally present. For example, temperature gradients exist from operation of a combustion engine, and in urban areas, large amounts of electromagnetic energy is present in the environment due to radio and television broadcasting. Thus, large-scale ambient energy, such as sun, wind, and tides is widely available; however, such energy may not be effectively captured with much efficiency or at low costs.

Even though some types of energy harvesters fueled by ambient energy may not produce sufficient energy to perform mechanical work, small amounts of power can be generated. Harnessing ambient mechanical vibrations to produce sustainable power sources may have several applications in aerospace and outer space, for example, where ambient mechanical vibrations are plentiful. Other applications that may be pursued include using scavenged energy to power remote wireless sensors that have applications in structural health monitoring (SHM), and also to power micro-electromechanical systems (MEMS), for example. Still further, energy harvesting may be useful when applied to small, wireless autonomous devices, such as those used in wearable electronics and wireless sensor networks.

SUMMARY

In one aspect, a sensor-based energy harvesting device is described. The sensor-based energy harvesting device comprises an ionic polymer-metal composite (IPMC) thin film including a first and a second surface, and metal electrodes coupled to the first and the second surfaces. The metal electrodes include homogenously dispersed carbon nanotubes (CNT) in an epoxy resin system to form a CNT-epoxy electrode coating, and the CNT-epoxy electrode coating is substantially uniformly dispersed on the first and the second surface. When the IPMC thin film is subjected to a bending motion, an electric potential develops between the metal electrodes.

In another aspect, a sensor-based energy harvesting device is provided that comprises an ionic polymer-metal composite (IPMC) thin film including a first and a second surface, a first layer of a metal electrode substantially uniformly dispersed on the first surface, and a second layer of a metal electrode substantially uniformly dispersed on the second surface. One of the first layer or the second layer includes homogenously dispersed carbon nanotubes (CNT) in an epoxy resin system to form a CNT-epoxy electrode coating. When the IPMC thin film is subjected to a bending motion, an electric potential develops between the metal electrodes.

In still another aspect, a method of forming a sensor-based energy harvesting element is provided. The sensor-based energy harvesting element is an energy harvesting element that when subjected to a bending motion an electric potential develops between electrodes of the energy harvesting device. The method comprises heat treating an ionic polymer-metal composite (IPMC) thin film, placing a mask on a portion of a first surface and on a portion of a second surface of the IPMC thin film, and depositing a metal electrode coating on the first surface and on the second surface of the IPMC thin film so as to form substantially uniform electrode coatings. The metal electrode coating includes homogenously dispersed carbon nanotubes (CNT) in an epoxy resin system to form a CNT-epoxy electrode coating. The method also comprises removing the mask from the first surface and the second surface of the IPMC thin film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and are made part of this disclosure.

Energy harvesting elements or membranes are composites that exhibit characteristics of both actuators and sensors, for example. Such elements have also been applied in fuel cells. To enable use for fuel cells, electrical conductivity and mechanical durability of the materials may be enhanced. In particular, a life of such a battery/fuel cell in general can be enhanced using combinations of other materials.

In example embodiments for use as a fuel cell, naturally occurring energy can be harvested and converted by exposing an active material of the membrane to an ambient activation condition and harvesting at least a portion of energy that is created. For example, energy harvesting from fluidic and flow environments can be accomplished using types of energy harvesters, such as flexible polymers.

Figure 1A:
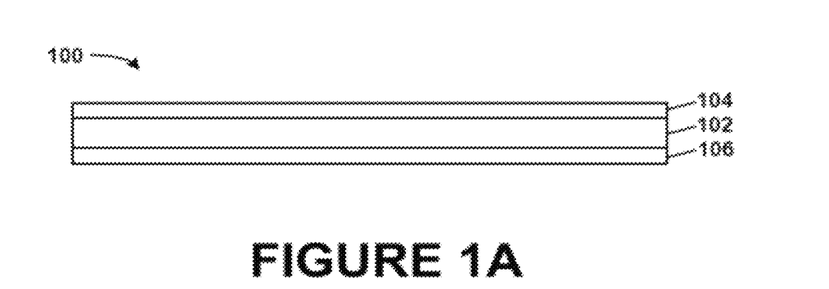
FIG. 1A illustrates a side view of an example energy harvesting element.

FIG. 1A illustrates a side view of an energy harvesting element 100 (or device) including a polymer 102 coupled to or coated with an electrode 104 and 106 on either side of the polymer 102. The polymer 102 may be a rectangular shape and include the electrode 104 and 106 coating on opposing sides of a length of the polymer 102. The polymer 102 may be a polystyrene backbone membrane, such as Nafion or Flemion, for example.

The polymer 102 may be any type of active material like multifunctional composites made of Electro-Active Polymer (EAP) (such as Ion-containing polymers or conducting polymers) coated with thin films of metal electrodes, or Piezoceramic material systems for use as mechanical to electrical energy transducers. For example, EAP films respond to electrical stimulation with a change in shape and size and are classified based on actuation mechanism as electronic or ionic EAP. One example of a specific type of an ionic EAP is an ionic polymer-metal composite (IPMC), which includes a base polymer membrane coated with a metal to act as a surface electrode.

The polymer 102 may include perfluorinated ionomers which contain side chains of ionic groups like sulfonate or carboxylic groups. Perfluorinated alkenes have large polymer backbones and the side chains provide the ionic groups that interact with a solvent to produce active characteristics.

In an example embodiment, a base of the polymer 102 may be Nafion R 117 (DuPont®), which is a co-polymer of polytetrafluoroethylene (PTFE) and a perfluorinated vinyl ether sulfonate. In other examples the base of the polymer 102 may be Flemion, or other ion-containing polymers. Nafion is slender, flexible, rugged and can sustain large strains making the material useful for high stress environments. The ability to endure large strains also allows Nafion to have a large stroke that may be useful since operating frequencies are estimated to be between about 0.2 and about 4.2 Hz, for example. In example embodiments below, Nafion IPMC may be used as a sustainable power generating source in different media such as air, deionized water, and ionic fluids, for example.

In one example, the energy harvesting element 100 may be an IPMC that includes a polyelectrolyte membrane or polymer 102 (e.g., such as Nafion or Flemion) plated on both or opposite faces by a noble metal (e.g., electrodes 104 and 106), and neutralized with a certain number of counter ions available in an electrolyte medium that balance an electrical charge of anions covalently fixed to a backbone polymer chain of the membrane. Ionic content factors into an electromechanical response of the material. The electromechanical response also depends on morphology of the metal and electrode, a nature of the cations, and level of hydration, for example.

In the polymer 102, for example, electromechanical coupling is ionic diffusion, which includes motion of mobile cations. The polymer 102 has fixed anions while the cations are mobile and readily available in the electrolyte. When the polymer 102 is hydrated, the cations diffuse toward an electrode (e.g., 104 or 106) on a surface of the polymer 102 under an applied electric field. Inside the polymer structure, anions in interconnected clusters provide channels for the cations to flow toward the electrode. This motion of ions causes the polymer 102 to bend toward the anode. Bending the polymer 102 will also force ion diffusion and produce voltage, which can be measured or collected through electrodes. When the polymer 102 is subjected to an oscillatory bending motion, an electric potential is developed. Energy may be harvested from these motions using capacitors and AC/DC converters to produce sustainable power, for example.

In addition, due to the presence of a polystyrene backbone polymer in the silver-epoxy resin electrode system, there may be enhanced hydration of the polymer 102. Therefore, presence of water increasingly enables the electrodes 104 and 106 to harvest more energy. The random backbone networks of the polymer 102 on which the silver nanoparticles are dispersed also enhance hydration of the polymer 102 (e.g., Nafion membrane) underneath.

The electrodes 104 and 106 may be noble metals, such as platinum (Pt), gold (Au), or silver (Ag), for example, or may include mixtures of noble metals with other materials. The electrodes 104 and 106 may be bonded to the polymer 102 using a dispersion technique to coat the polymer 102, which allows the electrodes 104 and 106 to cover a large surface area of the polymer 102.

Examples types of electrode coatings include a silver-epoxy or amorphous Carbon-black-epoxy. Using silver within the electrodes 104 and 106 may lead to better oxidation of counter-ions in an electrolyte. For example, silver atoms have filled d-orbitals with energy below Fermi energy leading to good oxidation of counter-ions in the electrolyte. In addition, silver may provide enhanced hydration of the membrane due to the polystyrene backbone of silver coating and random spaces. Other materials may be used to coat the membrane as well. For example, another coating material, platinum (Pt), has incompletely filled d-orbital and an energy exceeding the Fermi energy level, which may lead to relatively less oxidation and hence less possible energy to harvest. As a further example, a combination of platinum and silver may be used as the electrode coating.

The silver-epoxy and amorphous Carbon-black epoxy electrodes may be realized by coating the polymer 102 with metal electrodes including substantially homogenously dispersed silver or carbon-black (about 60% by weight) in polystyrene and an epoxy-resin based conductive hardener. Further, the electrode coated polymer can then be cured in about room temperature settings.

Further, by using a polystyrene backbone polymer to disperse silver nanoparticles as the electrodes 104 and 106 of energy harvesting element 100, a larger surface area is provided at the polymer network level for charge collection, mechanical stability is increased due to the polymeric backbone, and more water channels are created for hydration of the ionic membrane underneath the electrodes 104 and 106, for example. Using dispersion techniques to coat the electrodes 104 and 106 thus provides such example benefits. The electrodes 104 and 106 may alternatively be bonded to the polymer 102 using other coating methods, such as, for example, spraying, sol-gel deposition, electro-deposition, or vapor phase sputtering.

In example embodiments, the electrodes 104 and 106 further may include a mixture of carbon nanotubes (CNT). For example, an electrode coating including homogenously dispersed CNTs in an epoxy-resin form a CNT-epoxy electrode coating. The CNT-epoxy electrode can be realized by dispersing about 5% CNT (by weight) in an epoxy-resin system, followed by mixing the system to achieve a near-homogenous dispersion resulting in a CNT-epoxy mixture. The CNT-epoxy mixture can then be substantially uniformly coated on surfaces of the polymer 102 to form the electrodes 104 and 106. While coating the electrodes 104 and 106, the polymer 102 may be masked to ensure that the electrodes 104 and 106 are not deposited at edges of the polymer 102 to prevent end-leakage of charges or a short-circuit due to continuity of electrodes across a thickness of the polymer 102, for example. After coating the electrodes 104 and 106, the polymer 102 may be cured using infrared (IR) irradiation to cure the CNT-epoxy mixture and to obtain an effective strength of the energy harvesting device element 100. This leads to an increase in fatigue strength of the CNT-based energy harvesting device element 100.

Using of CNTs within the electrodes 104 and 106 may improve charge collection properties of the energy harvesting element 100 due to creation of a percolation network of CNTs within cracks (described below), which may also improve hydration of the ionic membrane. In addition, mechanical flexibility of the energy harvesting element 100 is increased because of the CNT network acting as a mechanical backbone for force transfer.

In FIG. 1A, two elongated surfaces of the polymer 102 are shown to be entirely coated with the electrode 104 and 106. However, in other embodiments, only a portion of surfaces of the polymer 102 may be coated, or only one surface or a portion of one surface may be coated with an electrode coating. Placement of the coating and an amount of the coating may vary depending on an application of the energy harvesting element.

In one example, the electrode coating 104 and 106 may be deposited in channels of the polymer 102. For example, channels less than about one centimeter wide may be present lengthwise along the polymer 102 from one end to the other end, and may be about 2-3 cm long. The electrodes 104 and 106 may be deposited in the channels to form a substantially uniform coating on a surface of the polymer 102. Due to the individual channels, the coating of the electrode may include texture or a certain pattern. The electrode coating 104 and 106 may be of a thickness of about 0.1 mm to about 0.01 mm, for example.

In addition, the electrode coating 104 and 106 may be spaced away from edges of the polymer 102 by about 1 mm to about 4 mm, for example, and the coating may have a thickness of about 500 microns or less. During deposition of the electrode, a mask may be placed on the polymer 102 over the edges, and the mask can be removed after application of the electrode. Sides of the polymer 102 may not include any electrode coating, for example.

A flow of charge in the energy harvesting element 100 may be from the electrode 104 to the electrode 106, or from the electrode 106 to the electrode 104. A continuous flow of charge can be achieved with a substantially uniform CNT electrode coating, for example, when the energy harvesting element 100 is subjected to an actuation environment, such as within a flow of sea water.

A connection to the electrodes 104 and 106 may be made at any location on the polymer to connect the energy harvesting element 100 to a circuit. For example, a connection may be made from a top of the polymer 102, and the connection may include a thin metal weld connection diffused to the polymer 102, for example.

Figure 1B:
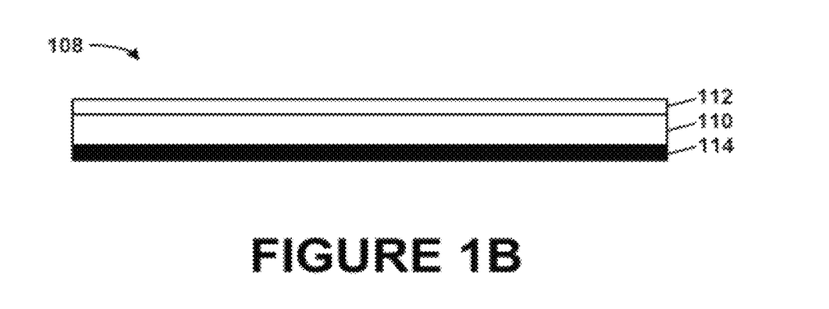
FIG. 1B illustrates a side view of another example of an energy harvesting element.

FIG. 1B illustrates another embodiment of an energy harvesting element 108 including a polymer 110 in which only one side of the polymer 110 includes an electrode coating 112. The other side of the polymer 110 includes a graphitic or carbon coating 114, for example. The electrode coating 112 and/or the coating 114 may be substantially uniformly covering surfaces of the polymer 110, or may cover only portions of surfaces of the polymer 110, for example. The energy harvesting element 108 may be a hybrid type device. In such a hybrid device, the polymer 110 can undergo bending. On an anode or metal based electrode (e.g., electrode coating 112) of the energy harvesting device 108, porous channels will allow hydrogen to flow inside the perfluorinated membrane of the polymer 110. In presence of a second electrode (cathode) (e.g., graphitic or carbon coating 114) on the other/second surface of the polymer 110, oxygenation will be required. At the cathode layer, hydrogen ions coming through the perfluorinated backbone of the polymer 110 will react with oxygen. As a result, current will flow in an outer circuit between the cathode to anode and water will be produced due to the hydrolysis type reaction. Such a hybrid device with two outer electrodes 112 and 114 along with a deformable perfluorinated membrane polymer 110 will produce a current that is a combination of hydrogen ion migration and resulting proton exchange via hydrolysis, in addition to the bending deformation induced charge previously explained.

In FIGS. 1A-1B, only one layer of a polymer is shown, however, in other embodiments, energy harvesting devices may include a multilayer stack of polymers so as to prevent high bending forces, for example. A stack of polymers may act as a single homogenous device with surface electrodes deposited on outermost surfaces that can be actuated using a single source of energy. A stack of polymers that has layers of polymers with two separated electrodes will have current added in parallel (with proper arrangement to avoid backflow into neighboring polymers). Alternatively, multiple energy harvesting devices may be combined and connected in series. When different devices are connected in series to amplify output voltage, the devices may require many/distributed sources of energy, for example. Use of multiple layers of polymers in an energy harvesting device, or use of multiple energy harvesting devices will depend on the application.

Figure 2A:
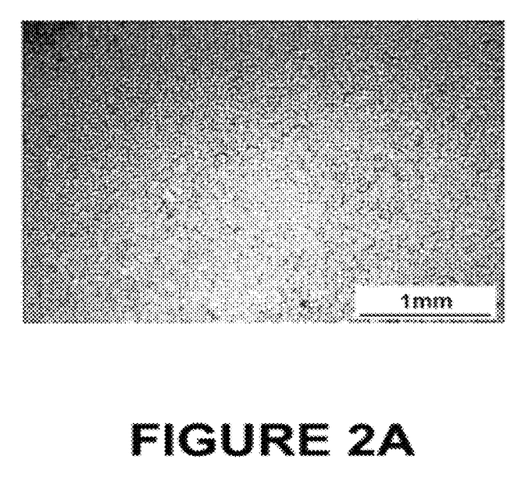
FIG. 2A is an optical micrograph of a surface of an unused energy harvesting element.
Figure 2B:
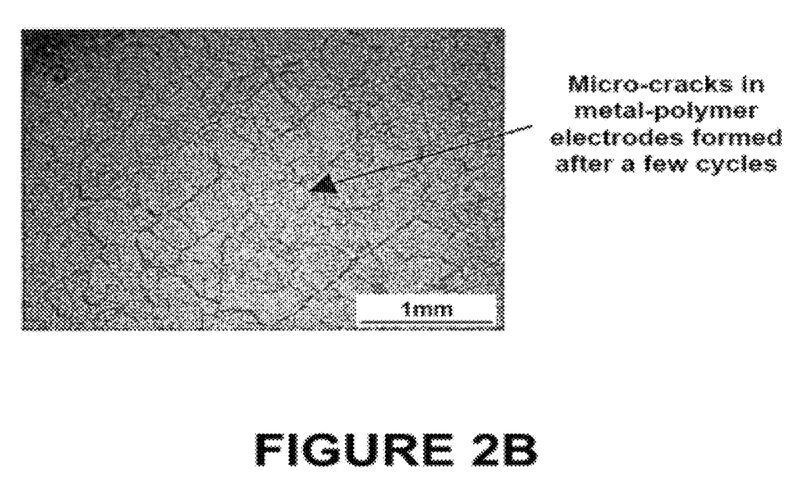
FIG. 2B is an optical micrograph of the surface of FIG. 2A after 25,000 cycles of mechanical bending deformation in an electrolyte medium.

FIG. 2A is an optical micrograph of a surface of an unused (or slightly used) energy harvesting element. The surface includes a metal electrode coating of silver illustrated to be uniform over the surface. FIG. 2B is an optical micrograph of the surface shown in FIG. 2A after 25,000 cycles of mechanical bending deformation in an electrolyte medium. The electrode surface is subjected to micro-cracking, which leads to delamination of the silver electrode at the polymer-metal electrode interface at later stages.

The electrode coating may develop the micro-cracks within a first few cycles of deformation. The electrode coating may further develop micro-cracks upon coating on the polymer, during subsequent polymerization, and during initial cycling. These micro-cracks give rise to islands of electrodes on the membrane of the polymer. When the polymer is subjected to mechanical bending deformation, resulting strains lead to internal stress generation that may exceed a tensile strength of the layer of electrodes. This further opens up the micro-cracks and hydration channels along a lamellar structure of the polymer that may lead to delamination of the electrodes. The micro-cracks aggregate within an initial few cycles due to water swelling of the polymer after which the crack morphology may stabilize and slowly grow leading to fatigue degradation. If the electrode is a purely metalized electrode, crack growth may be enhanced leading to reduction in charge flow. The growth of electrode cracking occurs in metalized electrodes because the metal is in weak cohesion in particulate form that may not prevent the growth of micro-cracks, for example.

The micro-cracks or other formation defects due to migration and intercalation of heavy and large ions limits a life of the material, or may degrade output electrical energy due to electrolyte deposition in the micro-cracks.

In example embodiments herein, conductive or semi-conductive nanotubes and/or nanowires (e.g., carbon Nanotubes of hollow a cylindrical form or nanowires of a solid cylindrical form) can be used to produce a percolation network through the micro-cracks of the electrode surface to improve a life of the membrane by reinforcing the morphology of the electrode. A percolation network refers to charge transport (e.g., transport of conduction electrons or ions) in the polymer membrane through a conductive media, i.e., electrodes and electrolyte surrounding the polymer membrane. In an IPMC, for example, charge transfer occurs through the percolation pathway created by a network of sulphonic ($-SO_3^-$) spherical clusters.

The initial cracking of the electrode coating leads to seepage of the water/electrolyte into the polymer which keeps the polymer membrane hydrated and flexible, and increases the percolation of charges with increased availability of cations (e.g., $H^+$ in case of deionized water or salt ions like $Na^+$ or $Li^+$ in case of electrolytes). Thus, the initial micro-cracking of the polymer is, to an extent, helpful for hydration of the polymer, but growth of these micro-cracks is undesirable. With increased percolation of charges, there is a possibility of de-lamination of electrodes as has been observed in silver-based IPMCs.

However, in example embodiments of CNT-based IPMCs, de-lamination of electrodes is not observed due to the mechanical reinforcement property of the CNTs. This leads to an approximate uniform nature of stress transfer over the polymer membrane resulting in enhanced fatigue life of the IPMC, for example. The CNTs form a network that helps sustain tensile stress because of their high stiffness and high fracture strain, and helps to limit or prevent growth of the initial micro-cracks. The CNTs-based electrodes also help to provide continuous hydration of the polymer over a large number of cycles for energy harvesting. However, using higher percentages of CNTs to improve the cohesion and mechanical strength of the polymer may lead to higher stiffness of the energy harvesting element, which can reduce bending deformation and hence the performance of energy harvesting element.

Figure 3:
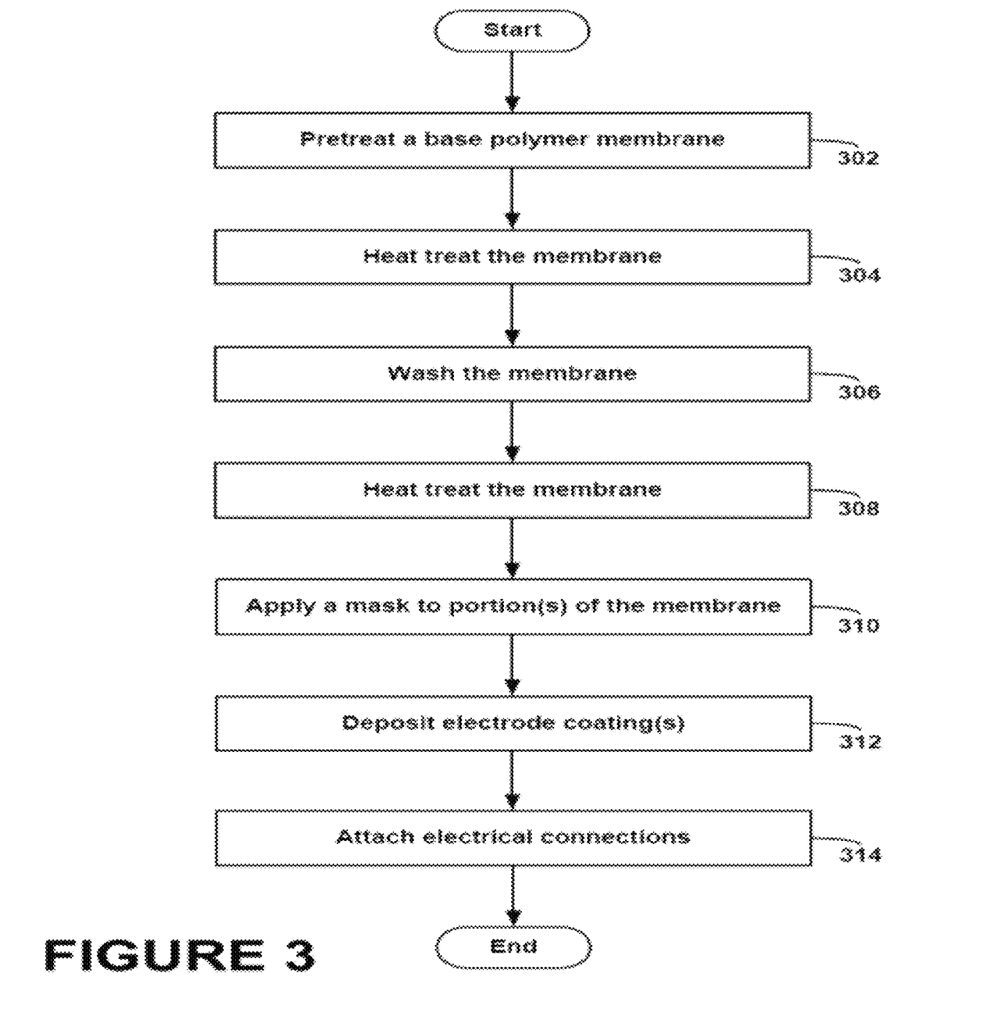
FIG. 3 is a flowchart that depicts example steps for preparing an energy harvesting device using nanotubes.

FIG. 3 is a flowchart that depicts example steps for preparing an energy harvesting device using nanotubes. A base polymer membrane (e.g., an EAP which is capable of ion transport, such as Nafion) may be used for the device, and can initially be pretreated for surface roughening, as shown at block 302. For example, emery paper can be used to sand the membrane followed by ultrasonic washing of the membrane to remove any residue. The membrane may then be heat treated (e.g., boiled) in dilute hydrochloric acid (e.g., HCl 2N solution) for approximately 30 minutes, as shown at block 304, and then washed with deionized water, and shown at block 306. The membrane can again be boiled in deionized water to further remove any acidic content, as shown at block 308. The steps of heating and washing may be optional or may be repeated based on an application or condition of the membrane, for example.

In some embodiments, after the membrane is dried, a thin coating of metal electrodes are coated on either side of the membrane. In addition, the electrode coating may be spaced away from edges of the polymer by about 1 to about 4 mm, for example. Thus, during deposition of the electrode, a mask may be placed on the polymer over the edges, and the mask can be removed after application of the electrode, as shown at block 310. Sides of the polymer may not include any electrode coating, for example.

After the mask is placed, the electrode coating may be deposited, as shown at block 312. The electrodes may include substantially homogenously dispersed silver nanoparticles (approximately 60% by weight) into polystyrene resin and a conductive hardener. For example, the silver electrode may be dispersed on the polymer surface using a soft brush to ensure a uniform and consistent layer on the surface. Other methods of dispersion may include sol-gel methods, dip coating, sputtering, inkjet printing, or spin-coating, for example. Using a homogenously method of electrode deposition may result in better binding between the electrode and the base polymer as compared to what can be achieved using sputtering and electro-chemical deposition methods, for example. The binding between an electrode (e.g., the silver coating) and the polymer (e.g., the Nafion membrane) can be achieved using this dispersion process.

A composition of the silver electrode may be in the range of about 40% to about 100% silver by weight, for example. Using pure silver (e.g., about 100%) may provide low mechanical stability and low hydration. Alternatively, using less than 100%, or about 40% or lower silver by weight may provide a predominantly polystyrene based mechanical backbone with good hydration and lesser charge collecting performance. An amount of silver by weight in the electrode may depend on an application and a desired power output.

In example embodiments, the electrodes may further includes a mixture of carbon nanotubes (CNT). For example the electrode may include CNTs dispersed homogenously in an epoxy-resin system. The CNT-epoxy electrodes may be realized by dispersing about 5% CNT (by weight) in an epoxy-resin based conductive hardener, followed by mixing in an emulsifier to achieve a near-homogenous dispersion of a CNT-epoxy mixture. The CNT-epoxy mixture can then be coated substantially uniformly on the polymer to form the electrodes. While coating the electrode mixture, the polymer can be masked (as described at block 310) to limit any end-leakage of charges (e.g., no short-circuit between the two surface electrodes). After coating the electrodes, the polymer can be cured using IR irradiation, for example.

The CNT may be embedded in or coated on the electrode layer to enable a resulting coated metal-polymer electrode system that has the electronic charge transport properties of CNTs along with the mechanical strength properties of CNTs. Electrical energy output from surface electrodes functionalized in the coated metal-polymer system may be increased, as well as improving an overall fatigue life due to formation of a mechanically strong percolation network formed by the CNT within the electrodes. The CNTs strengthen the electrodes after a conductive matrix material of the electrodes become micro-cracked and/or agglomerated/intercalated under cyclic mechanical deformation or receive defects due to solid-electrolyte interface phenomena. For example, the percolation network of CNTs fills in the microcracks, and improves output energy efficiency as well fatigue life of the energy harvesting device.

Subsequently, electrical leads or connection points may be included on the electrode coating, as shown at block 314, to enable attachment of devices to the IPMC power cell so as to harvest energy created by the IPMC power cell, for example.

IPMC systems may be either sensor-based or actuator-based. An IPMC sensor-based system is one in which on application of a bending load, the energy harvesting device produces a voltage across the electrodes. In contrast, an IPMC actuator-system is one in which on application of voltage across the electrodes, a deformation is produced. The deformation due to such an actuation is small compared to what deformations in mechanical/hydrodynamic energy harvesting sensor systems.

Mechanisms and causes of fatigue differ within these two different phenomena of sensor-based systems and actuator-based systems. While in the actuator based systems, an amount of applied voltage is the cause for fatigue, in the sensor-based energy harvesting systems, the applied bending load is the direct cause for fatigue. Results obtained for known actuator systems working for only a few 100 cycles under controlled environments are not the same for sensor based systems that work 50,000 cycles under practical conditions. For example, degradation in an actuator-based system begins at a certain threshold voltage, such as at voltages higher than 2.0 volts (over about a 150 micro-meter thickness of a platinum electrode actuator-based IPMC), the electrolysis of water in the polymer leads to the degradation in the displacement output of the IPMC. For a platinum electrode actuator-based IPMC, degradation in displacement may begin after about 1000 cycles of actuation in an ionic liquid, while for the same in water will set-in after about 100,000 cycles.

In actuator-based systems, deformations are on the order of millimeters upon an application of voltage across the system. For example input voltage ranging from about 0.1 to 5 volts over a few 100 micrometers thick membrane, and a corresponding deformation ranges from 0.25 mm to about 35 mm.

Example embodiments include integration of CNT-based electrodes for sensor-based energy harvesting devices for enhanced fatigue resistance. The enhanced fatigue results of sensor-based CNT energy harvesting devices over a continuous working period of about 72,000 seconds (nearly 20 hours) is a function of consistent or substantially consistent energy density generated by the CNT energy harvesting device. Furthermore, the consistent and enhanced energy density is a few orders of magnitude higher as compared to previous results for silver-only electrode based energy harvesting devices.

Energy generation using example embodiments of a CNT-based electrode of an energy harvesting device operated as a sensor-based system is not due to motion of CNTs with respect to the matrix within the polymer itself. Rather, the CNTs serve a dual purpose in that the CNTs are mechanical reinforcements as well as charge collectors in the electrodes, and energy generation occurs within the polymer through a lamellar structure of the polymer across its thickness under bending deformation, for example.

In sensor-based systems, application of bending deformation upon forcing the membrane yields a voltage across a thickness of the membrane. The deformation in terms of displacement for sensor-based systems ranges between about 5 mm to 100 mm for sample lengths of membranes in the range of about a few centimeters. Applying a small deformation to the membrane results in a voltage development. Amounts of voltage depend on an induced strain. With a thin, soft membrane of about a 5 mm deformation, bending strain will occur and may result in generation of about 1 mV, for example, within a hydrated environment. Higher concentration electrolytes in the hydrated environment give lower voltages. Thus, voltage outputs also depend on an environment in the system is used. In addition, using this membrane under dynamic conditions of changing frequencies of deformation or strain varies and affects voltage outputs. For example, a polymer with a CNT-based electrode of about 4 cm long operated at frequencies of about 7-8 Hz produces a voltage of about 80 mV.

Many different types of CNTs may be used in the electrode mixture. Types of CNTs can be chosen for inclusion within the electrode mixture that have specific energy band gap and morphology for a percolation network based on a required energy scale for a desired output, for example.

The properties of a CNT are characterized by the nanotube chirality indices (n, m) defined on a two-dimensional graphene sheet. Values of n and m determine the chirality of a CNT. The chirality in turn affects a conductance of the nanotube. CNTs are considered to be metallic if the value of {(n−m)=3q} (where q is an integer). While in the case {(n−m)≠3q}, CNTs are considered semi-conducting.

Given the nanotube chirality indices n and m, a diameter of a CNT can be determined using the relationship:

$$d = \frac{a_0 \sqrt{n^2 + m^2 + nm}}{\pi} \quad \text{Equation (1)}$$

where $a_0$ is a lattice constant of a hexagonal graphene with a value of 2.461 angstroms.

Figure 4:
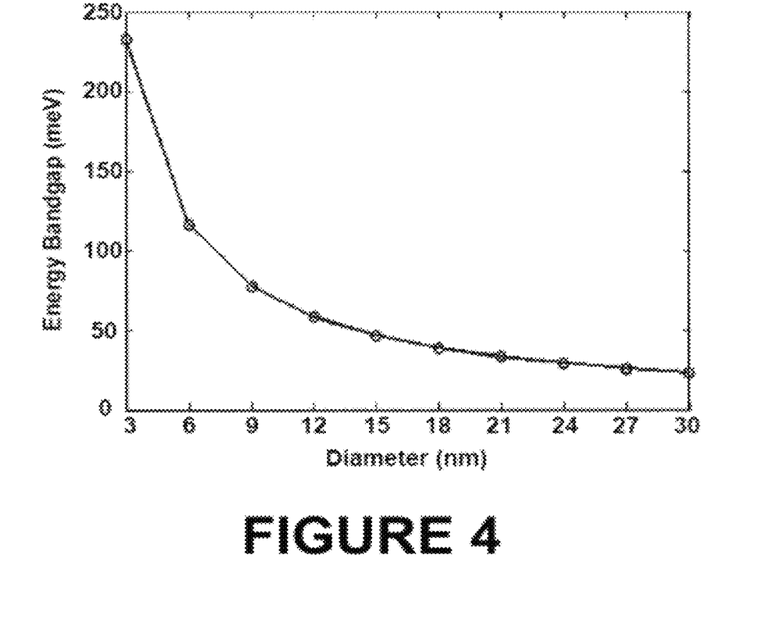
FIG. 4 illustrates a graph of an example variation in energy bandgap of CNTs for different diameters.

Further, given the diameter of the nanotube, an energy bandgap can be determined using the relationship:

$$E_{gap} = 2\gamma_0 a_{c-c}/d \quad \text{Equation (2)}$$

where $\gamma_0$ is a tight binding overlap energy of a carbon-carbon (C—C) bond, $a_{c-c}$ is a nearest neighbor C—C bond distance (e.g., 0.142 nm) and d is the diameter of the CNT. FIG. 4 illustrates a graph of an example variation in energy bandgap of CNTs for different diameters.

A resistance of the CNT can be expressed as a Taylor series expansion in the Fermi-level energy using the relationship:

$$R = \frac{1}{|t_p|^2} \frac{h}{8e^2} \times \left[1 + \exp\left(\frac{E_{gap}}{k_B T}\right)\right] \quad \text{Equation (3)}$$

where $|t_p|^2$ is a probability of electron transmission across the bandgap, $E_{gap}$ is an energy bandgap and $k_B T$ is a thermal energy. Furthermore, resistivity can be calculated, and in turn, the conductivity of the CNT can be obtained.

An example aspect in selecting metallic CNTs as the percolation network in the electrodes is to enhance charge collection properties as a function of network density. Based on a required energy scale for a desired output, a diameter of the CNT can be determined, and the values of n and m may be interpolated to select an appropriate CNT.

Figure 5:
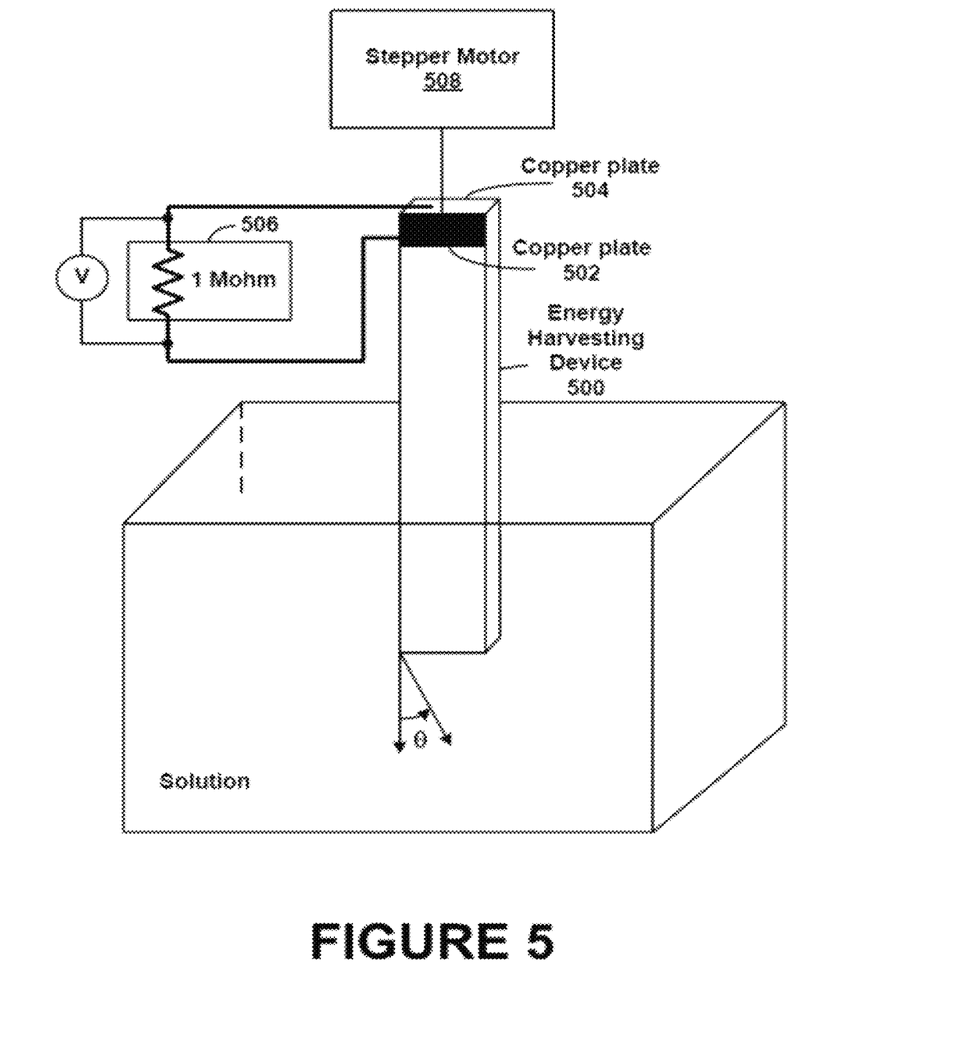
FIG. 5 illustrates an example experimental arrangement to analyze output electrical energy density of an example energy harvesting device.

To analyze output electrical energy density of an example energy harvesting device described herein, an experimental arrangement was established as shown in FIG. 5. An energy harvesting device 500, such as a silver nanoparticle/CNT mixture coated IPMC, includes two copper plates 502 and 504 as end clamps acting as leads on opposing sides of the energy harvesting device 500 at one end. Two electrically insulating poly-propylene strips (not shown) can be used to grip the copper plates 502 and 504. The pair of copper plates 502 and 504 performs as the electrical interconnects.

The energy harvesting device 500 may be a strip of IPMC (Nafion) membrane of dimensions of about 0.04 m×about 0.02 m×about 0.001 m. The energy harvesting device 500 in this example may have a surface area of about 10.4 cm$^2$ (5.2 cm×2 cm). The energy harvesting device 500 may be of other lengths, widths, and heights, or be in ranges of between about 0.4 cm-6 cm×about 0.2 cm-2 cm×about 0.1 mm-0.1 cm, for example. In some examples, the energy harvesting device 500 may weigh about 0.3 g. In example embodiments, the energy harvesting device 500 may include any electro-active polymer composite including an ion-containing polymer or conductive polymer, and includes an electrode coating, such as CNT dispersed in an epoxy-resin system.

A load 506, such as a resistive load of 1 MOhms, can be connected in series with the energy harvesting device 500 to utilize energy generated by the energy harvesting device 500. The example value of electrical resistance is chosen as this is comparable to internal impedance of an IPMC strip, for example. To simulate movement of the energy harvesting device 500, the energy harvesting device 500 is connected to a stepper motor 508 (e.g., via an aluminum extension not shown). The stepper motor 508 can be driven using a BJT current amplifier, for example. A control input to the stepper motor 508 can be triggered via a micro-controller that instructs the stepper motor 508 to rotate in a clockwise direction for a given time interval and to rotate in an anticlockwise direction for the same time interval. This movement establishes an oscillatory or flapping type motion of the energy harvesting device 500. Variation in amplitude and frequency of oscillations is obtained by modifying movement of the stepper motor 508. A frequency is changed by varying internal delay between each step of the stepper motor 508. An oscillation amplitude is modified by varying a duty cycle of rotational motion in each direction. The oscillations of the stepper motor 508 are adjusted so that the motion is approximately centered to a vertical plane and so that there are equal deflections in both directions.

The energy harvesting device 500 is placed within a solution (e.g., a salt electrolyte solution of various concentrations or de-ionized water) and the motion of the stepper motor 508 is applied. A maximum deflection of the stepper motor 508 maintains the energy harvesting device 500 immersed in the solution. After connecting leads to the resistive load, a voltage across the resistive load is measured. Electromagnetic shielding can be used to reduce or eliminate noise in the measured voltage. In FIG. 5, θ is an approximate maximum angular displacement of the energy harvesting device 500 from a mean position.

Experiments were performed in air, deionized water, and sodium chloride (NaCl) electrolyte with NaCl concentrations of about 5 g/l, about 19 g/l, and about 35 g/l. For example, the highest concentration of about 35 g/l substantially corresponds to salt concentration in sea water.

The energy harvesting device 500 generates energy due to a motion of charges between the CNT electrode coatings through the Nafion polymer, for example. The motion of charges can be increased by hydrating the energy harvesting device 500. The motion of charges leads to a current and a potential difference between the two sides (e.g., electrodes) of the energy harvesting device 500. Once energy is created, any type of circuit may be connected to the energy harvesting device 500 to utilize the energy, such as the load 506 illustrated in FIG. 5. Alternatively, capacitors may be connected to the energy harvesting device 400 to store the charge that is generated, for example.

Figure 6A:
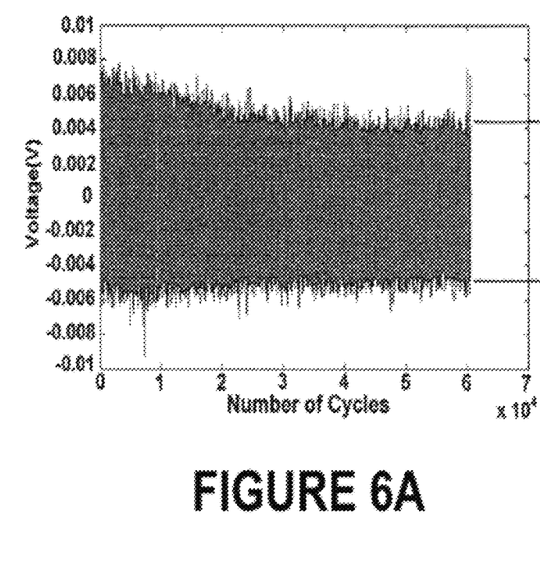
FIGS. 6A and 6B show a time history of voltage generated by example energy harvesting devices over a period of 60,000 cycles on application of continuous cyclic mechanical bending deformation.
Figure 6B:
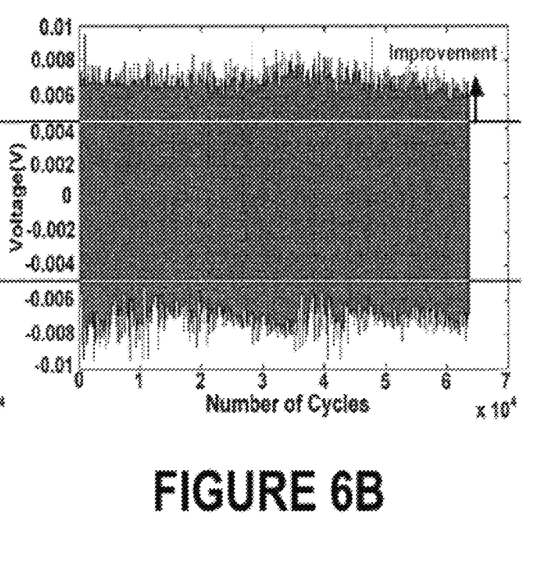

FIGS. 6A and 6B show a time history of voltage generated by example energy harvesting devices over a period of 60,000 cycles on application of continuous cyclic mechanical bending deformation. In FIG. 6A, voltage generated by an energy harvesting device comprised of a silver-coated IPMC device. As shown in FIG. 6A, the output voltage decreases from about 0.008V to about 0.004V over about 60,000 cycles. Thus, the output voltage decreases by about half, and performance gradually degrades due to fatigue and settles down to a minimal voltage generation.

In FIG. 6B, voltage generated by an energy harvesting device comprised of a silver/CNT coated IMPC device. As shown in FIG. 6B, the output voltage remains approximately constant at about 0.008V for the first 60,000 cycles. Thus, using CNT within an electrode of the energy harvesting device increases the voltage output after 60,000 cycles by about 25% to about 50% in continuous generation of energy. The improved electro-mechanical performance of the CNT infused electrode over 60,000 cycles indicates contribution of the CNT in fatigue resistance due to creation of percolation networks for effective charge transport over a longer lifetime.

Figure 7:
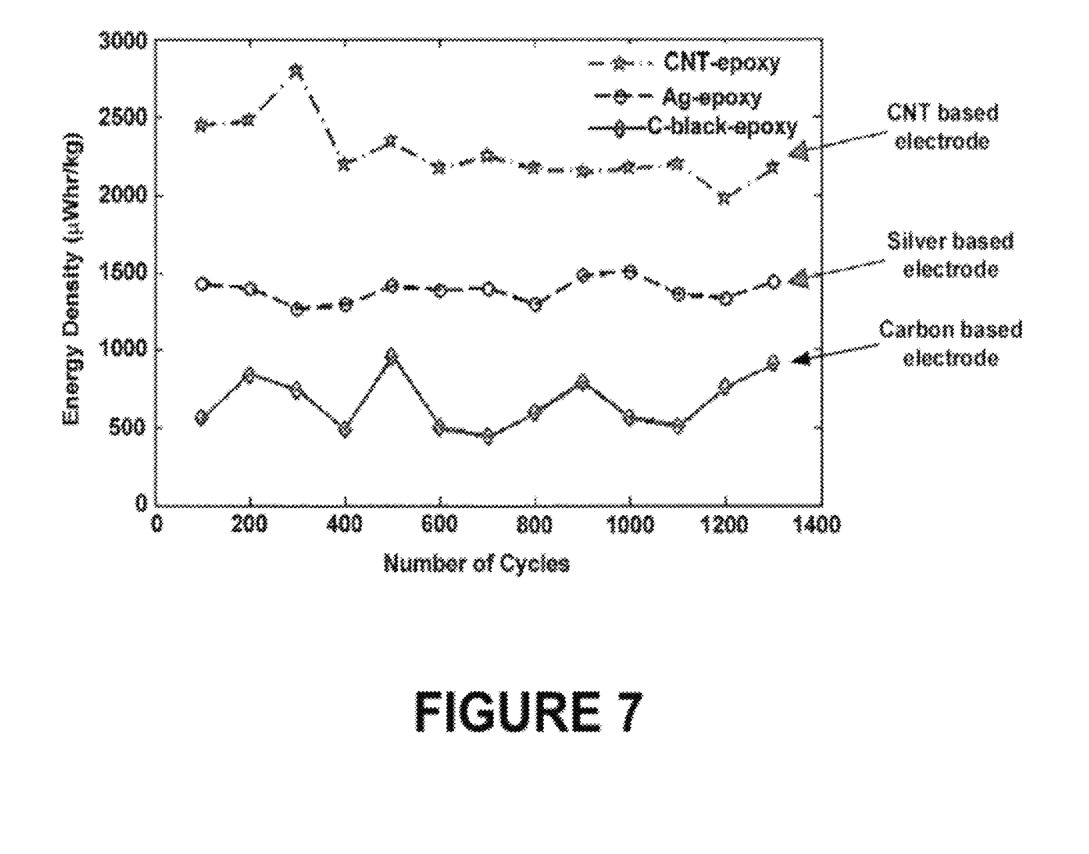
FIG. 7 is a graph that illustrates energy density generated by example energy harvesting devices under hydrated conditions for different metal electrodes.

FIG. 7 is a graph that illustrates energy density generated by example energy harvesting devices under hydrated conditions for different metal electrodes. For example, the graph illustrates energy densities generated by energy harvesting devices coated with different electrodes including a CNT-epoxy polymer, a silver-epoxy polymer, and an amorphous carbon-epoxy polymer. Experiments were performed in hydrated conditions including in a salt electrolyte (NaCl) with an NaCl concentration of about 20 g/L. This concentration was chosen considering practical hydrodynamic energy harvesting conditions, such as tidal energy harvesting in which salt concentration (NaCl) in sea water is in the range of about 30-35 g/L, for example. Other hydrated environments may also be used, such as solid state electrolytes and gels that have high ionic conductivity with little (<0.5%) liquid content. Solid state electrolytes and gels are single ion conductors in which conductivity occurs due to one ionic species through a lattice of immobile counter ions (which are usually polymers). Depending on a need of charge transport, a component of electrolyte, the cation or anion, may move through the structure as a charge carrier. An example solid electrolyte is yttria-stabilized zirconia (YSZ). Other types of electrolytes include Na β"-Alumina (e.g., a polycrystalline ceramic solid electrolyte), and $Zr(HPO_4)_2 \cdot nH_2O$ (e.g., a Zirconium based inorganic solid electrolyte).

As shown in FIG. 7, the CNT-epoxy coated energy harvesting device has energy density in a range of about 2000-2500 μWhr/kg, the silver-epoxy coated energy harvesting device has energy density of about 1500 μWhr/kg, and the carbon-epoxy coated energy harvesting device has an energy density in a range of about 500-1000 μWhr/kg. The graph in FIG. 7 shows that the electro-mechanical performance of the CNT-coated energy harvesting device is about twice that of the silver-coated energy harvesting device and about five times that of the amorphous carbon coated energy harvesting device. As a consequence of using CNTs within the electrodes, there is an improvement in the morphology of the metal-electrode and the polymer-metal electrode interfacial bonding that leads to an increased ability to withstand higher mechanical stresses without degradation in electro-mechanical performance, thus enhancing life of the energy harvesting device for practical energy harvesting, for example.

Figure 8:
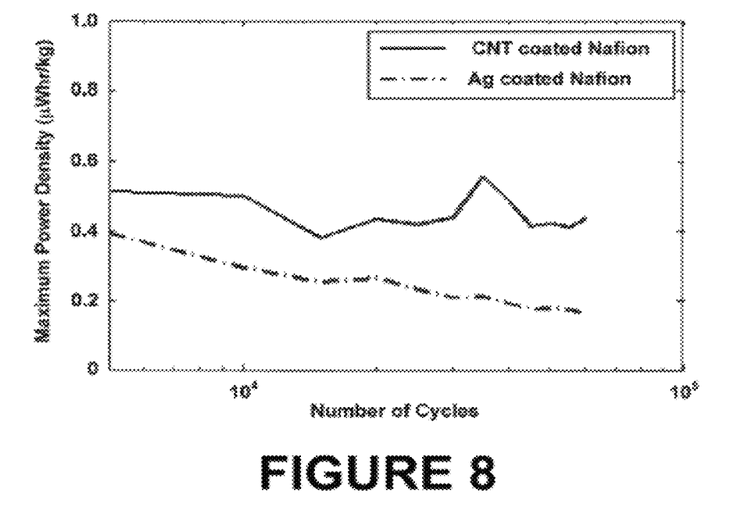
FIG. 8 is a graph that illustrates comparison of maximum power density generated by a CNT-coated energy harvesting device and a silver coated energy harvesting device subjected to 60,000 cycles of mechanical bending deformation.

FIG. 8 is a graph that illustrates comparison of maximum power density generated by another example CNT-coated energy harvesting device and another example silver coated energy harvesting device subjected to about 60,000 cycles of mechanical bending deformation. The graph illustrates an increase in a maximum peak-to-peak power density using CNT within the electrode coating. This result indicates an improvement in fatigue life of the energy harvesting device due to sustained energy harvesting over a period of 60,000 cycles bending deformation. For the silver coated energy harvesting device, a maximum power density generated reduces to half an initial value with an increase in operation over 60,000 cycles.

Figure 9:
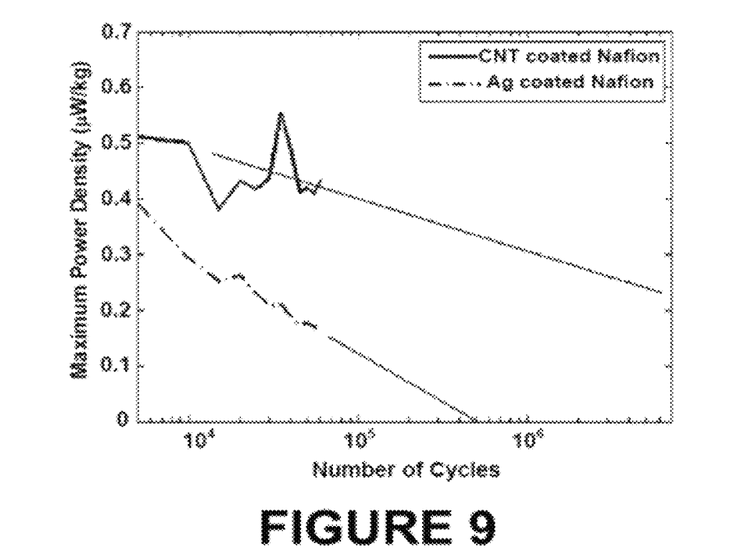
FIG. 9 is a graph that illustrates a maximum power density of a CNT electrode coated polymer and a silver electrode coated polymer over a number of cycles of use in log scale.

FIG. 9 is a graph that illustrates a maximum power density of another example CNT electrode coated polymer and another example silver electrode coated polymer over a number of cycles of use in log scale. Upon extrapolation, an estimated lifetime of the silver-based electrode polymer is about $0.4 \times 10^6$ cycles while an estimated lifetime of the CNT-based electrode polymer is about $500 \times 10^6$ cycles, for example. The extrapolated lines indicate an expected lifetime until complete failure in terms of power generation.

The graph in FIG. 9 illustrates that a single CNT electrode coated IPMC membrane (e.g., of an area of about 40 mm×20 mm) produces a power density of about 0.5 micro-W/kg, which becomes a specific power of about 0.13125 $pW/m^2$.

Figure 10:
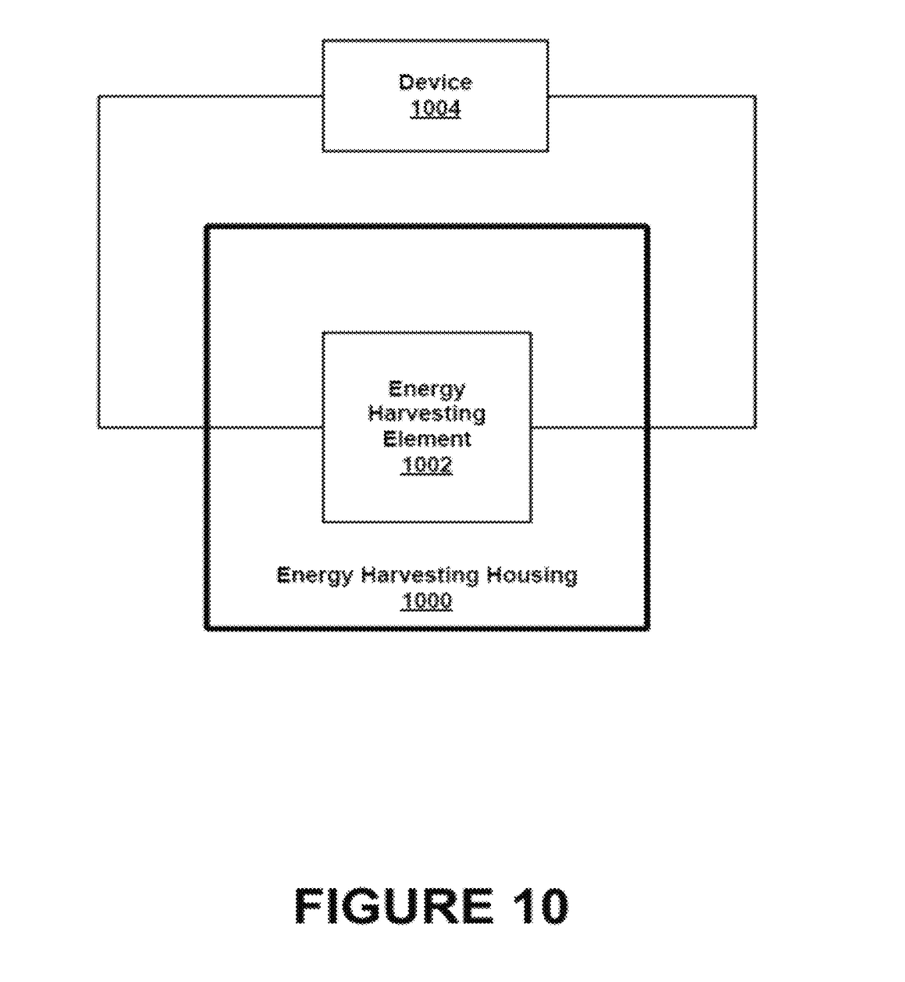
FIG. 10 illustrates an example energy harvesting system.

In an example embodiment, an energy harvesting system may be used to harvest energy from a sensor-based energy harvesting device. FIG. 10 illustrates an example energy harvesting system. The system may include a structure 1000 housing an energy harvesting element 1002. The structure may be positioned to receive environmentally created vibrations, and may be designed according to a type of environmentally created vibration to be received. The system may further include a device 1004 in communication with the energy harvesting element 1002 to harvest energy, such as an energy collecting device (e.g., capacitor, fuel cell). The device 1004 may be any type of device and varies depending on an application of the system. The device 1004 may be connected to the energy harvesting element 1002 through leads, for example.

Thus, upon application of a bending load to the energy harvesting element 1002, the energy harvesting element 1002 produces a voltage across the electrodes. The energy harvesting element may be a polymer with an electrode coating. The electrode coating may be infused with CNTs as described herein.

The IPMC-based energy harvesting device is mechanically flexible and easily formable, non-toxic and bio-compatible, responsive under low frequencies or semi-static conditions, efficient and workable in aqueous environments, and applicable for use with a wide variety of electrolytes including gels and solid-state electrolytes. In contrast to energy harvesting systems that use piezoelectric materials, which may be more limited in use.

Energy harvesting elements and devices of example embodiments described herein may be used for many different types of applications. Example applications include powering bio-medical implants (due to bio-compatibility), such as powering a pacemaker or a heart valve using a deformation mechanism on ventricular walls of the heart. Other applications include large scale applications such as flow induced waste water energy generation and tidal energy harvesting, for example.

A solid electrolyte and or gel electrolyte may be used in applications for packaging the membrane and enabling a hydrated state in applications such as wearable electronics (foot mounted device for powering electronic gadgets by walking), or packaged energy harvesting keypads to power small electronic circuits in computers and mobile phones, for example.

Using CNTs can improve fatigue life of an IPMC-based material for applications where cyclic mechanical deformation or stress play adverse roles. Example applications include hydrodynamic energy harvesting and electrode designs for super-capacitors where cyclic stresses are developed during electrical charging and discharging processes. Using example devices described herein, output energy densities of IPMC materials may be obtained that may be comparable to metal-oxide based super-capacitors.

Embodiments described herein may be useful in a wide array of telemedicine applications, for example. Nonconventional body placeable (bending-stretching of the embedded IPMC in open air and room temperature) or implantable sensors (IPMC in fluidic environment) may include small, flexible, long-lasting energy convertors. As other examples, clusters of sensors may be interwoven into textiles for use in shirts, belts, shoes, headgear, and other apparel. Bio-medical implant devices and associated electronic control systems can also be powered using fluidic embedded IPMCs undergoing bending strain due to deformation of organs and limbs in the human body. Due to polymer type base materials, IPMCs can be an integral part of a host structure such as implant, hemodynamic devices, blood flow in arteries, valve, clothing, energy harvesting from pipe flow in sewage environment, pipe flow in home appliances, and several other applications, for example.

Furthermore, where target devices (e.g., wireless devices) need to be powered under low vibration (devices with rotary motion and other moving parts) or in fluidic environments (e.g., in medical implant and diagnostic devices), a flexible polymer based thin film of a desired shape can produce required power from environmental sources of energy. IPMC based energy harvesting systems may be used for applications including tidal wave energy harvesting, residual environmental energy harvesting to power MEMS and nanoelectromechanical system (NEMS) devices, and sensors and actuators for biomedical, aerospace and oceanic applications, for example.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A sensor-based energy harvesting device comprising:
   an ionic polymer-metal composite (IPMC) film including a first and a second surface;
   a first electrode coating on the first surface, wherein the first electrode coating includes a carbon nanotube (CNT)-epoxy mixture comprised of an epoxy resin substantially homogenously dispersed with about 5% carbon nanotubes by weight; and
   a second electrode coating on the second surface, wherein the second electrode coating includes the (CNT)-epoxy mixture comprised of an epoxy resin substantially homogenously dispersed with about 5% carbon nanotubes by weight.

2. The sensor-based energy harvesting device of claim 1, wherein the first and the second surface are entirely coated with the CNT-epoxy mixture.

3. The sensor-based energy harvesting device of claim 1, wherein the CNT-epoxy mixture is dispersed on the first and the second surface spaced away from edges of the first and second surface by about 1 mm to about 4 mm.

4. The sensor-based energy harvesting device of claim 1, wherein the CNT-epoxy mixture is deposited on the first and the second surface to form substantially uniform coatings.

5. The sensor-based energy harvesting device of claim 1, wherein the first and second electrode coatings are of a thickness of about 0.1 cm or less.

6. The sensor-based energy harvesting device of claim 1, further comprising an energy collector connected to the IPMC film to collect energy generated by the IPMC film.

7. The sensor-based energy harvesting device of claim 1, wherein the IPMC includes a base ion-containing polymer.

8. The sensor-based energy harvesting device of claim 1, wherein the energy harvesting device is operated at frequencies between about 0.2 Hz and about 4.2 Hz.

9. The sensor-based energy harvesting device of claim 1, wherein the IPMC film is a polymer membrane having dimensions in the ranges of about 0.4 cm-5.2 cm×about 0.2 cm-2 cm×about 0.1 mm-0.1 cm.

10. The sensor-based energy harvesting device of claim 1, wherein the IPMC film is a rectangular shape, and wherein the first and the second surface are opposing substantially planar surfaces along a length of the IPMC film extending from a first end to a second end.

11. The sensor-based energy harvesting device of claim 1, wherein the CNTs create a percolation network within cracks that develop in the first and second electrode coating when the IPMC film is subjected to a bending motion.

12. The sensor-based energy harvesting device of claim 11, wherein a type of a CNT is selected based on a specific energy band gap and morphology for the percolation network.

13. The sensor-based energy harvesting device of claim 1, wherein the CNTs mechanically reinforce the first and second electrode coating.

14. The sensor-based energy harvesting device of claim 1, wherein the CNTs function as charge collectors in the first and second electrode coating, and energy generation occurs across a thickness of the IPMC film when subjected to a bending motion.

15. A sensor-based energy harvesting device comprising:
an ionic polymer-metal composite (IPMC) film including a first surface and a second surface;
a first electrode substantially uniformly dispersed on the first surface; and
a second electrode substantially uniformly dispersed on the second surface,
wherein one of the first electrode or the second electrode includes a (CNT)-epoxy mixture comprised of an epoxy resin substantially homogenously dispersed with about 5% carbon nanotubes by weight.

16. The sensor-based energy harvesting device of claim 15, further comprising an energy collector connected to the IPMC film to collect energy generated by the IPMC film.

17. The sensor-based energy harvesting device of claim 15, wherein one of the first electrode or the second electrode layer is a graphic coating.

* * * * *